United States Patent
Ruhnau et al.

(10) Patent No.: US 7,948,046 B2
(45) Date of Patent: May 24, 2011

(54) OPTOELECTRONIC COMPONENT

(75) Inventors: Marcus Ruhnau, Weiding (DE); Bert Braune, Wenzenbach (DE); Patrick Kromotis, Regensburg (DE); Georg Bogner, Lappersdorf (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 12/879,130

(22) Filed: Sep. 10, 2010

(65) Prior Publication Data

US 2010/0327307 A1    Dec. 30, 2010

Related U.S. Application Data

(63) Continuation of application No. 12/242,170, filed on Sep. 30, 2008, now Pat. No. 7,795,633, which is a continuation of application No. 11/141,721, filed on May 31, 2005, now Pat. No. 7,429,758, which is a continuation of application No. 10/611,225, filed on Jun. 27, 2003, now Pat. No. 6,900,511.

(30) Foreign Application Priority Data

Jun. 28, 2002 (DE) .................................. 102 29 067

(51) Int. Cl.
*H01L 31/113* (2006.01)

(52) U.S. Cl. .................. 257/432; 257/E33.072; 257/95; 257/98; 257/433; 362/232; 313/486

(58) Field of Classification Search .......... 257/E33.061, 257/E33.072, 95, 98, 432–434, 666, 678, 257/788; 362/232, 240; 313/486
See application file for complete search history.

(56) References Cited

U.S. PATENT DOCUMENTS

| | | | |
|---|---|---|---|
| 4,168,102 A | 9/1979 | Chida et al. | |
| 4,727,457 A | 2/1988 | Thillays | |
| 4,905,075 A | 2/1990 | Temple et al. | |
| 4,935,665 A | 6/1990 | Murata | |
| 5,043,716 A * | 8/1991 | Latz et al. | 345/82 |

(Continued)

FOREIGN PATENT DOCUMENTS

DE    195 36 454 A1    9/1995
(Continued)

OTHER PUBLICATIONS

Frank Mollmer et al:, Siemens SMT-TOPLED LED's for Surface Mounting, Siemens Components 29 (1991), pp. 147-149.

(Continued)

*Primary Examiner* — Chris Chu
(74) *Attorney, Agent, or Firm* — Cohen Pontani Lieberman & Pavane LLP

(57) ABSTRACT

An optoelectronic component having a basic housing or frame and at least one semiconductor chip, specifically a radiation-emitting or-receiving semiconductor chip, in a cavity of the basic housing. In order to increase the efficiency of the optoelectronic component, reflectors are provided in the cavity in the region around the semiconductor chip. These reflectors are formed by virtue of the fact that a filling compound filled at least partly into the cavity is provided, the material and the quantity of the filling compound being chosen in such a way that the filling compound, on account of the adhesion force between the filling compound and the basic housing, assumes a form which widens essentially conically from bottom to top in the cavity, and the conical inner areas of the filling compound serve as reflector.

17 Claims, 1 Drawing Sheet

U.S. PATENT DOCUMENTS

| | | | |
|---|---|---|---|
| 5,245,620 A | | 9/1993 | Tanaka et al. |
| 5,875,205 A | | 2/1999 | Spaeth et al. |
| 5,907,151 A | | 5/1999 | Gramann et al. |
| 6,355,946 B1 | * | 3/2002 | Ishinaga ............ 257/98 |
| 6,459,130 B1 | | 10/2002 | Arndt et al. |
| 6,573,580 B2 | | 6/2003 | Arndt |
| 6,593,598 B2 | * | 7/2003 | Ishinaga ............ 257/98 |
| 6,605,828 B1 | | 8/2003 | Schwarzrock et al. |
| 6,610,563 B1 | | 8/2003 | Waitl et al. |
| 6,737,681 B2 | * | 5/2004 | Koda ............ 257/98 |
| 6,844,571 B2 | | 1/2005 | Krames et al. |
| 6,900,511 B2 | | 5/2005 | Ruhnau et al. |
| 6,909,123 B2 | * | 6/2005 | Hayashimoto et al. ........ 257/98 |
| 6,964,489 B2 | | 11/2005 | Blume et al. |
| 7,101,061 B2 | * | 9/2006 | Nagai et al. ............ 362/294 |
| 7,172,325 B2 | | 2/2007 | Kim et al. |
| 7,238,967 B2 | | 7/2007 | Kuwabara et al. |
| 7,312,927 B2 | | 12/2007 | Bogner et al. |
| 7,429,758 B2 | | 9/2008 | Ruhnau et al. |
| 7,514,279 B2 | | 4/2009 | Ruhnau et al. |
| 7,531,845 B2 | | 5/2009 | Oshio et al. |
| 7,586,190 B2 | * | 9/2009 | Bogner et al. ............ 257/717 |
| 2002/0057057 A1 | | 5/2002 | Sorg |
| 2002/0070386 A1 | | 6/2002 | Krames et al. |
| 2003/0002272 A1 | | 1/2003 | Suehiro et al. |
| 2003/0038295 A1 | | 2/2003 | Koda |
| 2003/0155624 A1 | | 8/2003 | Arndt |
| 2003/0178627 A1 | | 9/2003 | Marchl et al. |
| 2003/0219919 A1 | * | 11/2003 | Wang et al. ............ 438/26 |
| 2004/0089898 A1 | | 5/2004 | Ruhnau et al. |
| 2005/0093005 A1 | | 5/2005 | Ruhnau et al. |
| 2005/0218531 A1 | | 10/2005 | Ruhnau et al. |
| 2006/0138621 A1 | | 6/2006 | Bogner et al. |
| 2006/0232969 A1 | | 10/2006 | Bogner |

FOREIGN PATENT DOCUMENTS

| | | |
|---|---|---|
| DE | 197 55 734 A1 | 12/1997 |
| DE | 199 18 370 A1 | 4/1999 |
| EP | 1 011 151 A2 | 12/1999 |
| JP | 60-63970 | 4/1985 |
| JP | 10215001 | 8/1998 |
| JP | 11-284234 | 10/1999 |
| JP | 11-289110 | 10/1999 |
| JP | 2001-223390 | 8/2001 |
| JP | 2002-33517 | 1/2002 |
| JP | 2003-142737 A | 5/2003 |
| WO | WO 02/33756 | 4/2002 |

OTHER PUBLICATIONS

Office Action dated Nov. 21, 2006 issued for the counterpart German Application No. 102 29 067.9-33 by the German Patent Office.
Computer generated English Translation of JP 2002-033517 from the JPO Website.

* cited by examiner

US 7,948,046 B2

OPTOELECTRONIC COMPONENT

CROSS REFERENCE TO RELATED APPLICATIONS

This application is a continuation of U.S. patent application Ser. No. 12/242,170 filed on Sep. 30, 2008, now U.S. Pat. No. 7,795,633, which is a continuation of U.S. Ser. No. 11/141,721 filed on May 31, 2005, now U.S. Pat. No. 7,429,758, which is a continuation of U.S. patent application Ser. No. 10/611,225 filed on Jun. 27, 2003 now U.S. Pat. No. 6,900,511 and claims priority to German application No. 102 29 067.9, filed on Jun. 28, 2002. The entire content of each of these applications is expressly incorporated herein by reference.

BACKGROUND OF THE INVENTION

1. Field of the Invention

The present invention relates to an optoelectronic component, in particular a surface-mountable optoelectronic component, having at least one semiconductor chip, which emits and/or receives electromagnetic radiation, and a reflective compound.

2. Description of the Related Art

Conventionally, in the production of surface-mountable optoelectronic components, by way of example, firstly a prefabricated electrical leadframe is encapsulated by injection-moulding with a suitable plastics material which forms the basic housing of the component. This basic housing has a cavity (or else chip window) into which leadframe terminals are introduced from two opposite sides. A semiconductor chip that emits and/or transmits electromagnetic radiation, such as an LED chip, for example, is bonded and electrically contact-connected on one of the said leadframe terminals. A transparent or translucent potting compound is built into the cavity. This basic form of surface-mountable optoelectronic components is disclosed for example in the article "SIEMENS SMT-TOPLED für die Oberflächenmontage" ["SIEMENS SMT-TOPLED for surface mounting"] by F. Möllmer and G. Waitl, Siemens Components 29 (1991), issue 4, pages 147-149.

In the case of such optoelectronic components, it is customary, for the purpose of increasing the external efficiency, to form the cavity with oblique inner areas which serve as reflector. Depending on the angle of inclination of the inner areas, the opening of the cavity is correspondingly enlarged thereby.

Examples of optoelectronic components with such reflector arrangements are disclosed for example in the document DE 197 55 734 A1 and the document DE 199 18 370 A1.

A similar construction is described in the document DE 195 36 454 A1. In this case, a metal chip carrier part on which the semiconductor chip is mounted is provided in a cavity of a basic housing of the component. A well is formed in the chip carrier part in the region in which the semiconductor chip is fixed, the inner areas of which well approximately correspond to the form of an inverted truncated cone and form a reflector for the radiation emitted by the semiconductor chip.

Advancing miniaturization of optoelectronic components entails more and more often the requirement for the narrowest possible openings of the cavity and/or for more complex semiconductor chip and wiring arrangements in the cavity. In these cases, for lack of space, the side walls of the cavity can often only be formed perpendicularly or at a steep angle with respect to the bottom area of the cavity.

The usually Lambert or even rearwards directed radiation or reception characteristic of the semiconductor chip means, therefore, that significant losses of luminous flux arise and a lower external efficiency of the component thus arises. Therefore, there is a need for optoelectronic components which have a sufficiently good efficiency despite the absence of reflectors, or reflectors that cannot be realized, at the inner areas of their cavities.

SUMMARY OF THE INVENTION

One object of the present invention is to provide an optoelectronic component of the type mentioned in the introduction, which as far as possible meets the demand outlined above.

This and other objects are attained in accordance with one aspect of the invention directed to an optoelectronic component including a carrier body and chip carrier substrate arranged on the carrier body, with a semiconductor chip having a region for at least one of emitting and receiving electromagnetic radiation arranged on a side of the chip carrier substrate facing away from the carrier body. A reflective filling compound is arranged on a side of the semiconductor chip, wherein a surface of the filling compound adjacent to the semiconductor chip and facing toward a front side of the optoelectronic component is arranged underneath or at the most levels with the region of the semiconductor chip for the at least one of emitting and receiving electromagnetic radiation. The reflective filling compound includes a resin filled with $TiO_2$ particles at least partially covers the carrier body and covers lateral faces of the chips carrier substrate.

According to another embodiment of the present invention, an encapsulation compound covers a side of the semiconductor chip remote from the chip carrier substrates. The semiconductor chip is electrically connected with a bonding wire, wherein the bonding wire is completely embedded by the filling compound and the encapsulation compound.

A method for producing an optoelectronic component includes formation of the basic housing with the cavity, positioning of the semiconductor chip in the cavity and filling of a filling compound into the cavity. The material and quantity of the filling compound are chosen in such a way that relative to a bottom area of the cavity, the filling height ($h_F$) thereof adjacent to the semiconductor chip is less than the distance between a laterally radiation-emitting and/or-receiving region of the semiconductor chip and the bottom area, and the surface thereof, as seen from the semiconductor chip, curves concavely in its course towards side walls of the cavity on account of the adhesion force between the material of the filling compound and the material of the side walls, and the surface is formed as a reflector for the radiation in this way.

The optoelectronic component according to the invention has a basic housing and at least one radiation-emitting and/or -receiving semiconductor chip in a cavity of the basic housing. Unlike in conventional optoelectronic components, the reflector is at least not solely realized by reflective side areas of the cavity of the basic housing itself, but rather is realized at least in part by a reflective filling compound filled into the cavity. For this purpose, the material and the quantity of the filling compound are preferably chosen in such a way that, during and/or after the filling process, on account of the adhesion force between the material of the filling compound and the material of the side areas of the cavity, the filling compound is drawn up at these side areas and forms a surface which is like a concave mirror, in particular is shaped like a parabola. This surface of the filling compound facing towards the front side of the housing serves as reflector area for electromagnetic radiation emitting and/or received by the semiconductor chip. The composition of the filling compound is selected, moreover, such that a highest possible proportion of the radiation is subjected to total reflection at the reflector area. This can be achieved by using materials with suitable refractive indices for the filling compound.

In other words, the cavity is partly filled with the filling compound and, on account of the adhesion force between filling compound and basic housing, an inner area of the filling compound which is essentially like a concave mirror, in particular concave[1]), from the point of view of the semiconductor chip is automatically established in the cavity since the filling compound creeps upwards at the lateral inner areas of the cavity of the basic housing. The concave-mirror-like inner areas of the filling compound that are thus formed form the reflector for the semiconductor chip inserted into the cavity.

[1] note: here and below—in contrast to the priority application (wherein "convex" is used)—the form of the inner area is referred to as concave as seen from the chip; as a precaution, it shall already be expressly pointed out at this juncture that the term "concave" used in the present case relates to the same inner area configuration referred to as "convex" in the priority application. This is already revealed unambiguously in the priority application simply from the fact that, as expressly described in the priority application, the form of the inner area is formed for example by the filling compound creeping upwards at the lateral inner areas of the cavity of the basic housing, and by the filling compound having a parabola-like inner area.

These reflector areas can be produced in a simple manner, even with very small openings of the cavities, by means of suitable apportioning of the filling compound in the cavity. Moreover, the terminals, wirings and the like which are present in the cavity are enclosed by the filling compound without any impairment of their functioning.

Consequently, with the measure according to the invention, even with optoelectronic components with narrow openings of the cavity and/or complex semiconductor chip and wiring arrangements in the cavity, it is possible to provide reflectors within the cavity and thus to increase the external efficiency of the components.

In a preferred embodiment of the invention, the material of the filling compound contains titanium oxide ($TiO_2$). In particular, the material of the filling compound is preferably an epoxy resin filled with $TiO_2$ particles. Particularly preferably, a proportion of $TiO_2$ in the filling compound is between about 10 and 50% by volume.

In a manner similar to that in the case of conventional optoelectronic components, preferably a free surface of the chip remaining after mounting of the chip in the cavity and connection of the chip to external electrical terminals by means of a bonding wire, for example, and filling-in of the filling compound is covered with a radiation-transmissive, in particular transparent, encapsulation compound which encloses the semiconductor chip and preferably fills the cavity to the greatest possible extent.

The method for producing the optoelectronic component having a basic housing and at least one semiconductor chip in a cavity of the basic housing may, for example, comprise the following method steps:

(a) formation of a basic housing around a leadframe, the basic housing having a cavity into which terminals of the leadframe are introduced;

(b) positioning and electrical contact-connection of at least one radiation-emitting or -receiving semiconductor chip into the cavity; and (c) partial filling of a filling compound into the cavity, the material and the quantity of the filing compound being chosen in such a way that the filling compound, on account of the adhesion force between the filling compound and the basic housing, assumes a form which widens essentially conically from bottom to top in the cavity, and the conical inner areas of the filling compound serve as reflector.

Preferably, afterwards in a further method step (d), a radiation-transmissive, in particular transparent, encapsulation compound is filled into the cavity in order to completely enclose the semiconductor chip in the cavity.

The reflectivity of an epoxy-resin-based filling compound containing a $TiO_2$ proportion is up to about 80%. In a comparison between optoelectronic components of identical design but with differently embodied filling compounds according to the invention or no filling compound according to the invention in the cavity, but rather exclusively with a transparent encapsulation compound for the semiconductor chip, it was possible to obtain an increase in the external efficiency by up to 20% or more based on the filling compound according to the invention.

Further advantages and advantageous developments of the optoelectronic component according to the invention and of the method for producing it emerge from the exemplary embodiments described below in conjunction with FIGS. 1 and 2.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE EMBODIMENTS

In the two exemplary embodiments, identical or identically acting constituent parts are provided with the same reference symbols in each case.

Figure 1:
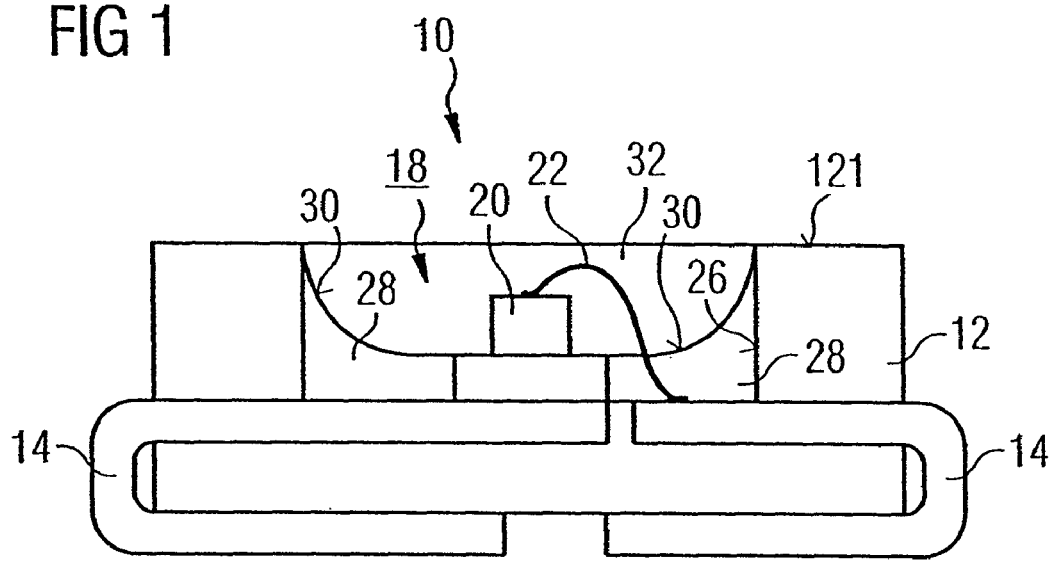
FIG. 1 shows a diagrammatic illustration of a sectional view of the first exemplary embodiment.

In the optoelectronic component 10 in accordance with FIG. 1, a basic housing 12 with cavity 18 is formed by encapsulating a leadframe 14 with a suitable plastics material by injection-moulding.

In the cavity 18, there is situated on the leadframe 14 a semiconductor chip 20 which emits and/or receives electromagnetic radiation, for example a light-emitting diode chip, which emits and/or receives at least part of the radiation via its side edges. The semiconductor chip 20 is connected to an electrical terminal of the leadframe 14 by means of a bonding wire 22. A reflective filling compound 28 is filled in between the semiconductor chip 20 and the side walls 26 of the cavity 18, the said filling compound comprising, for example, epoxy resin filled with $TiO_2$ particles, the proportion of $TiO_2$ in the filling compound 28 sufficing to significantly increase the reflectivity of the filling compound 28. The proportion of $TiO_2$ in the filling compound 28 preferably lies between about 10 and 50% by volume. Particles made of zirconium oxide, zinc oxide, barium sulphate, gallium nitride or a mixture of at least two of these types of particles are preferably suitable for use with an epoxy resin in the filling compound 28. It is important that the difference in refractive index between the epoxy resin and the particles is large enough such that the reflectivity of the filling compound 28 is increased.

The surface 30 of the filling compound, which faces towards the front side 121 of the basic housing 12, is curved concavely as seen from the semiconductor chip 20 and forms a reflector area at least for part of the laterally emitted and/or received radiation. Given corresponding geometry of the component 10 or the radiation characteristic of the semiconductor chip 20, a reflector area which is convex as seen from the semiconductor chip is conceivable as an alternative.

In addition to the semiconductor chip 20, a chip carrier substrate 24 (not illustrated in the figure) may be arranged between the said semiconductor chip and the basic housing 12, the dimensions of which chip carrier substrate are chosen in such a way that a trench is formed between its side edges 241 and the side walls 26 of the cavity 18, the filling compound 28 being situated in the said trench.

Relative to the bottom area of the cavity 18, the filing height $h_F$ of the filling compound 28 adjacent to the semiconductor chip 20 is less than the distance between the region of the relevant laterally emitting and/or receiving region of the semiconductor chip 20 and the bottom area. The filling height $h_F$ rises beyond the abovementioned distance in its course towards the side wall 26 of the cavity 18.

That free surface region of the semiconductor chip 20 which lies above the filling compound is covered by a radiation-transmissive encapsulation compound 32 and comprises an epoxy resin again, for example, or another suitable reaction resin.

Figure 2:
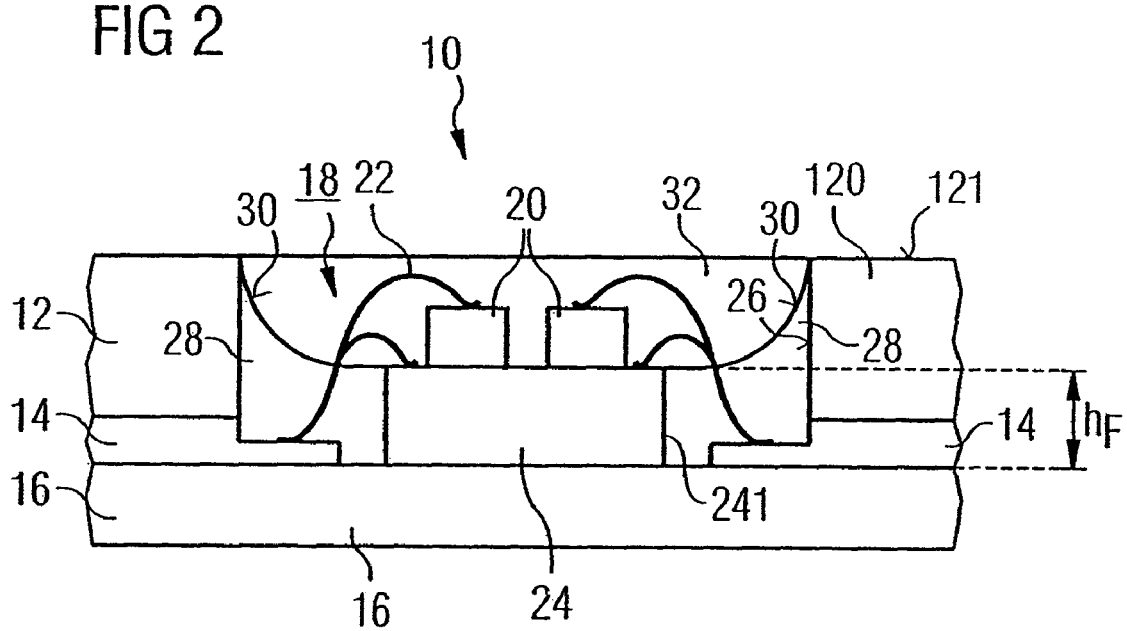
FIG. 2 shows a diagrammatic illustration of a sectional view of the second exemplary embodiment.

In the exemplary embodiment in accordance with FIG. 2 external electrical terminals 14 are applied on a carrier body 16 comprising aluminium, for example. The cavity 18 is realized by means of a plastic housing frame 120, which is likewise arranged on the carrier body 16.

In the cavity, two semiconductor chips 20 which emit and/or receive electromagnetic radiation, for example two light-emitting diode (LED) chips, are mounted on a chip carrier substrate 24 comprising silicon, for example. The two LED chips are electrically conductively connected to the electrical terminals 14 via bonding wires 22.

As is clearly discernible in the sectional view of FIG. 2, in the same way as in the exemplary embodiment described first, the inner areas 26 of the cavity 18 are virtually cylindrical, in other words they run very steeply from the bottom area to the front side of the basic housing 12. These steep side walls 26 have only a negligibly small reflector effect.

Given a uniform bottom area in the cavity, whose minimum size is fixedly predetermined by the size and number of the chips and/or the space requirement for chip mounting and contact-connection, a reduction of the steepness of the side walls 26 of the cavity would entail an enlargement of the component. This must be avoided in any case on account of the lack of space in many applications. This aim is achieved by means of the invention.

In the exemplary embodiment in accordance with FIG. 2, the cavity 18 is filled with a filling compound 28 in the region of the trench between the chip carrier substrate 24 and the side walls 26 of the cavity 18, the said filling compound for example comprising the same material as the filling compound 28 of the first exemplary embodiment.

As is clearly discernible in the sectional view of FIG. 2, the filling height $h_F$ of the filling compound 28 adjacent to the semiconductor chips 20, i.e. adjacent to the chip carrier substrate 24, is significantly smaller than adjacent to the side walls 26 of the cavity 18, where the filling compound 28 is drawn up essentially as far as the edge with the front side 121 of the basic housing 12. In this way, the surface of the filling compound 28 acquires a form opening essentially like a parabola towards the front side. Given a suitable choice of the material and the apportioning of the filling compound 28, this form results automatically on account of the adhesion forces between the filling compound 28 and the material of the housing frame 120. The concavely curved inner areas 30 of the filling compound 28 as seen from the semiconductor chips 20 serve as reflector for the radiation which is emitted and/or received laterally by the semiconductor chips 20.

The reflectivity of the filling compound 28 containing the $TiO_2$ proportion is up to about 80%. In comparison with an optoelectronic component in which the cavity is exclusively filled with a transparent filling compound, with the optoelectronic component 10 of the present invention it was thus possible to increase the external efficiency by up to 20% or more.

In order to protect the semiconductor chips 20, the cavity 18 is completely filled with a radiation-transmissive, for example transparent, encapsulation compound 32 which encloses the semiconductor chips 20 and is transmissive for the radiation to be emitted or to be received by the semiconductor chips 20. For this encapsulation compound 32, it is possible to use, as in the conventional components, suitable filling compounds comprising transparent synthetic resins, such as epoxy resin, for example, or comprising polycarbonate, which is preferably especially coordinated with the properties of the filling compound 28 (also applies to exemplary embodiment in accordance with FIG. 1).

It goes without saying that, in both exemplary embodiments, the number of semiconductor chips 20 in the cavity 18 of the basic housing 12 is not restricted to one or two; rather, it is also possible for more than two semiconductor chips to be mounted in the cavity. In addition, it is also possible for more than just one cavity 18 to be formed in a basic housing 12.

In order to produce an optoelectronic component 10 in accordance with the first or second exemplary embodiment, firstly the basic housing 12 with the cavity 18 is formed and then the semiconductor chip 20 is mounted in the cavity 18 and electrically conductively connected to the external electrical terminals 14. The filling compound 28 is subsequently inserted into the cavity 18. This is done by apportioning such that (i) relative to a bottom area of the cavity 18, the filling height $h_F$ of the filling compound adjacent to the semiconductor chip 20 is less than the distance between the laterally radiation-emitting and/or -receiving region of the semiconductor chip 20 and the said bottom area, and (ii) the surface of the filling compound, as seen from the semiconductor chip 20, is curved concavely in its course towards the side walls 26 of the cavity 18 on account of the adhesion force between the material of the filling compound 28 and the material of the side walls 26, consequently the filling compound creeps upwards at the side walls 26.

A surface 30 serving as reflector for the radiation is formed in this way.

The radiation-transmissive encapsulation compound 32 is subsequently filled into the cavity 18, which covers at least those surfaces of the semiconductor chip (20) which are still uncovered after the preceding steps.

It goes without saying that the above description of the invention on the basis of exemplary embodiments is not to be understood as a restriction of the invention thereto. Rather, the concept of the invention set forth in claims 1 and 12 can be employed in a multiplicity of widely different designs.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An optoelectronic component comprising:
a carrier body;
an electrically conductive chip carrier substrate arranged on said carrier body;
a semiconductor chip having a region for at least one of emitting and receiving electromagnetic radiation and being arranged on a side of said chip carrier substrate remote from the carrier body; and
a reflective filling compound comprising a resin filled with particles made of $TiO_2$,
wherein the filling compound is formed as a curved reflector;
wherein the filling compound covers at least partially the carrier body; and
wherein the filling compound covers lateral faces of the chip carrier substrate.

2. The optoelectronic component according to claim 1, wherein the filling compound completely covers the lateral faces of the chip carrier substrate.

3. The optoelectronic component according to claim 1, wherein the filling compound is in direct contact with the chip carrier substrate and the carrier body.

4. The optoelectronic component according to claim 1, wherein the filling compound is spatially separated from the semiconductor chip.

5. The optoelectronic component according to claim 1, wherein a side of the semiconductor chip remote from the chip carrier substrate is not covered by the filling compound, seen in a plan view onto said side of the semiconductor chip.

6. The optoelectronic component according to claim 1, wherein a filling height of the filling compound rises continuously in directions away from side faces of the chip carrier substrate.

7. The optoelectronic component according to claim 1, wherein a proportion by volume of $TiO_2$ particles in the reflective filling compound is between 10 and 50% by volume.

8. The optoelectronic component according to claim 1, wherein a surface of the filling compound adjacent to the chip carrier substrate and facing toward a front side of the optoelectronic component levels with the side of the chip carrier substrate remote from the carrier body.

9. The optoelectronic component according to claim 1, wherein a lateral extent of the chip carrier substrate exceeds a lateral extent of the semiconductor chip.

10. The optoelectronic component according to claim 1, wherein the semiconductor chip is electrically connected with at least one bonding wire, and wherein parts of the bonding wire are surrounded by the filling compound.

11. The optoelectronic component according to claim 10, further comprising a radiation-transmissive encapsulation compound that covers a side of the semiconductor chip remote from the chip carrier substrate,
wherein the bonding wire is completely embedded into the filling compound together with the encapsulation compound.

12. The optoelectronic component according to claim 1, wherein the semiconductor chip is electrically connected via the chip carrier substrate, so that in operation of the semiconductor chip an electrical current is led at least through parts of the chip carrier substrate.

13. The optoelectronic component according to claim 1, wherein the chip carrier substrate is made of silicon.

14. The optoelectronic component according to claim 1, wherein the carrier body includes a leadframe, and wherein the chip carrier substrate is situated on the leadframe.

15. The optoelectronic component according to claim 1, wherein in operation the semiconductor chip emits electromagnetic radiation via side edges.

16. The optoelectronic component according to claim 1, comprising a plurality of the semiconductor chips arranged on the side of the chip carrier substrate remote from the carrier body.

17. An optoelectronic component comprising:
a carrier body;
an electrically conductive chip carrier substrate arranged on said carrier body;
a bonding wire;
a semiconductor chip having a region for at least one of emitting and receiving electromagnetic radiation and being arranged on a side of said chip carrier substrate remote from the carrier body;
a radiation-transmissive encapsulation compound that covers a side of the semiconductor chip remote from the chip carrier substrate; and
a reflective filling compound comprising a resin filled with particles made of $TiO_2$,
wherein the semiconductor chip is electrically connected with the bonding wire;
wherein the bonding wire is completely embedded in the filling compound together with the encapsulation compound;
wherein the filling compound is formed as a curved reflector;
wherein the filling compound covers at least partially the carrier body; and
wherein the filling compound covers lateral faces of the chip carrier substrate.

* * * * *